(12) United States Patent
Tan et al.

(10) Patent No.: US 12,144,110 B2
(45) Date of Patent: Nov. 12, 2024

(54) REDUCED VERTICAL PROFILE EJECTOR FOR LIQUID COOLED MODULES

(71) Applicant: Intel Corporation, Santa Clara, CA (US)

(72) Inventors: Guixiang Tan, Portland, OR (US); Xiang Li, Portland, OR (US); Casey Winkel, Hillsboro, OR (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 809 days.

(21) Appl. No.: 17/134,028

(22) Filed: Dec. 24, 2020

(65) Prior Publication Data

US 2021/0120670 A1   Apr. 22, 2021

(51) Int. Cl.
| | |
|---|---|
| *H05K 1/11* | (2006.01) |
| *H05K 5/00* | (2006.01) |
| *H05K 5/02* | (2006.01) |
| *H05K 7/20* | (2006.01) |

(52) U.S. Cl.
CPC ............. *H05K 1/11* (2013.01); *H05K 5/0026* (2013.01); *H05K 5/0295* (2013.01); *H05K 7/20218* (2013.01)

(58) Field of Classification Search
CPC ...... H05K 1/11; H05K 5/0026; H05K 5/0295; H05K 7/20218
USPC ........................................................ 174/250
See application file for complete search history.

(56) References Cited

U.S. PATENT DOCUMENTS

| | | | | |
|---|---|---|---|---|
| 7,965,509 | B2 * | 6/2011 | Campbell | H01L 23/473 361/720 |
| 7,969,736 | B1 * | 6/2011 | Iyengar | H01L 23/4338 174/15.1 |
| 9,158,348 | B2 * | 10/2015 | Berk | G06F 1/20 |
| 9,245,820 | B2 * | 1/2016 | Goldrian | H01L 23/473 |
| 9,298,231 | B2 * | 3/2016 | Arvelo | F16L 41/10 |
| 10,021,811 | B2 * | 7/2018 | Schaltz | H05K 7/20772 |
| 10,582,645 | B1 * | 3/2020 | Kufahl | H05K 7/20772 |
| 2004/0175980 | A1 * | 9/2004 | Poh | H01R 13/6315 439/327 |
| 2009/0277616 | A1 * | 11/2009 | Cipolla | H01L 23/473 165/104.33 |
| 2010/0252234 | A1 * | 10/2010 | Cambell | H01L 23/473 165/80.2 |

(Continued)

FOREIGN PATENT DOCUMENTS

CN          112969340 A       6/2021

OTHER PUBLICATIONS

"Tube and pipe basics: How to achieve the perfect bend", the fabricator, https://www.thefabricator.com/thefabricator/article/tubepipefabrication/tube-and-pipe-basics-how-to-achieve-the-perfect-bend, Feb. 24, 2014, 6 pages.

(Continued)

*Primary Examiner* — Timothy J Thompson
*Assistant Examiner* — Michael F McAllister
(74) *Attorney, Agent, or Firm* — Compass IP Law PC

(57) ABSTRACT

An apparatus is described. The apparatus includes a printed circuit board (PCB) dual in-line memory module (DIMM) connector having ejectors. The ejectors have a small enough vertical profile to permit unbent liquid cooling conduits to run across the DIMM's semiconductor chips.

9 Claims, 6 Drawing Sheets

(56) References Cited

U.S. PATENT DOCUMENTS

| | | | |
|---|---|---|---|
| 2011/0209855 A1* | 9/2011 | Peterson | G06F 1/20 |
| | | | 165/104.26 |
| 2011/0286175 A1 | 11/2011 | Iyengar et al. | |
| 2012/0020022 A1* | 1/2012 | Peterson | H01L 23/4093 |
| | | | 361/699 |
| 2013/0120926 A1* | 5/2013 | Barina | H01L 23/4093 |
| | | | 165/80.4 |
| 2013/0135812 A1* | 5/2013 | Barina | H01L 23/4093 |
| | | | 165/173 |
| 2013/0194745 A1 | 8/2013 | Meijer et al. | |
| 2020/0305311 A1 | 9/2020 | Dallaserra et al. | |
| 2020/0344918 A1 | 10/2020 | Wondimu et al. | |

OTHER PUBLICATIONS

International Search Report and Written Opinion for PCT Patent Application No. PCT/CN2021/130052, Mailed May 12, 2022, 9 pages.

* cited by examiner

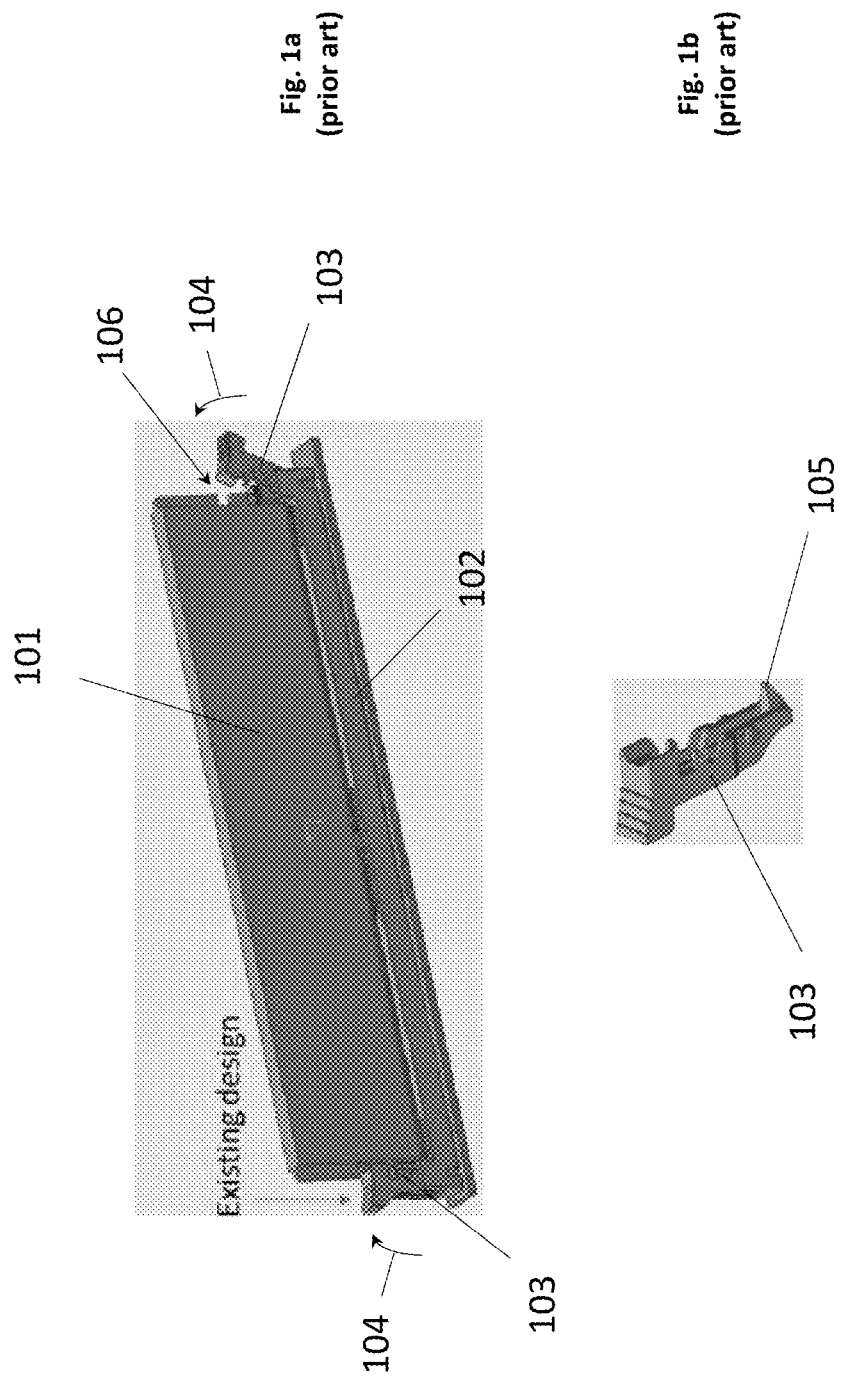

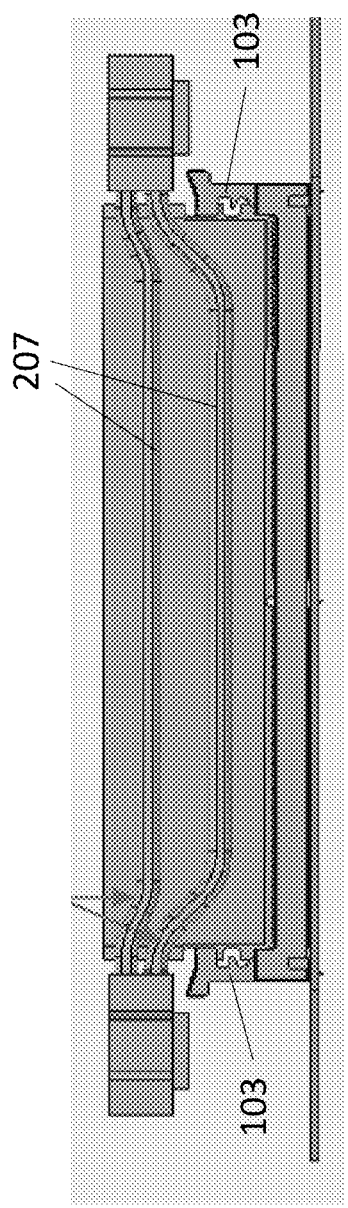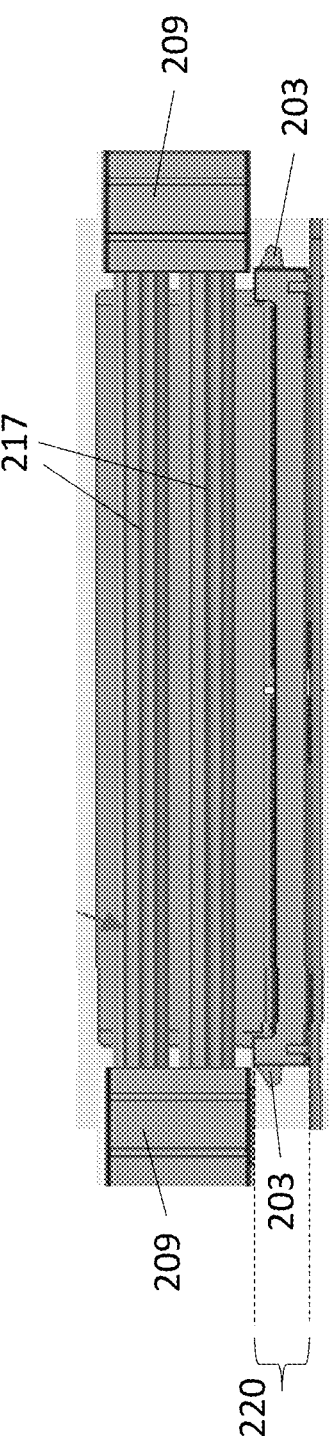

REDUCED VERTICAL PROFILE EJECTOR FOR LIQUID COOLED MODULES

FIELD OF INVENTION

The field of invention pertains generally to the electronic arts, and, more specifically, to a reduced vertical profile ejector for liquid cooled modules.

BACKGROUND

FIGS. 1a and 1b depicts a traditional dual in-line memory module (DIMM) and its mechanical connection mechanism to a printed circuit board (PCB) such as a motherboard in a computing system.

Prior to a DIMM 101 being connected to the DIMM connector 102 on the PCB, latches 103 that reside on both edges of the connector 102 are in an open position. When the DIMM 101 is pressed into the connector 102, the latches swing 104 to a closed position.

Here, when the DIMM 101 is being inserted into the connector 102, the bottom of the DIMM presses against a respective foot 105 on the bottom of each latch 103. The pressing action of the bottom of the DIMM 101 against the bottom feet 105 of the latches 103 causes both latches to rotate 104 about a pin/axis which, in turn, swings the respective upper part of both latches toward the DIMM.

While the DIMM is fully seated in the connector, the upper part of both latches are engaged with corresponding notches 106 in the sides of the DIMM 101. The engagement of the upper part of both latches 103 with the DIMM 101 keeps the DIMM 101 securely latched into the connector 102. That is, the notches 106 on both DIMM edges cannot rise vertically after latch engagement because the upper part of the latches 103 blocks the movement.

In order to release the DIMM, therefore, a user has to press down on the upper parts of the latches which, in turn, causes the latches to rotate to an open position and release the engagement of the upper part of the latches with the DIMM. The rotation of the latch ejects the DIMM 101 out of the connector 102. Specifically, the aforementioned feet 105 on the bottom of both latches 103 push the DIMM 101 out of the socket while the latches 103 are rotating to the open position. The latches 103 then fully swing to the open position.

FIGURES

A better understanding of the present invention can be obtained from the following detailed description in conjunction with the following drawings, in which:

FIGS. 1a and 1b show a prior art DIMM and latch;

FIG. 2a shows a problematic DIMM cooling conduit layout;

FIG. 2b shows an improved DIMM cooling conduit layout;

DETAILED DESCRIPTION

Figure 3A:
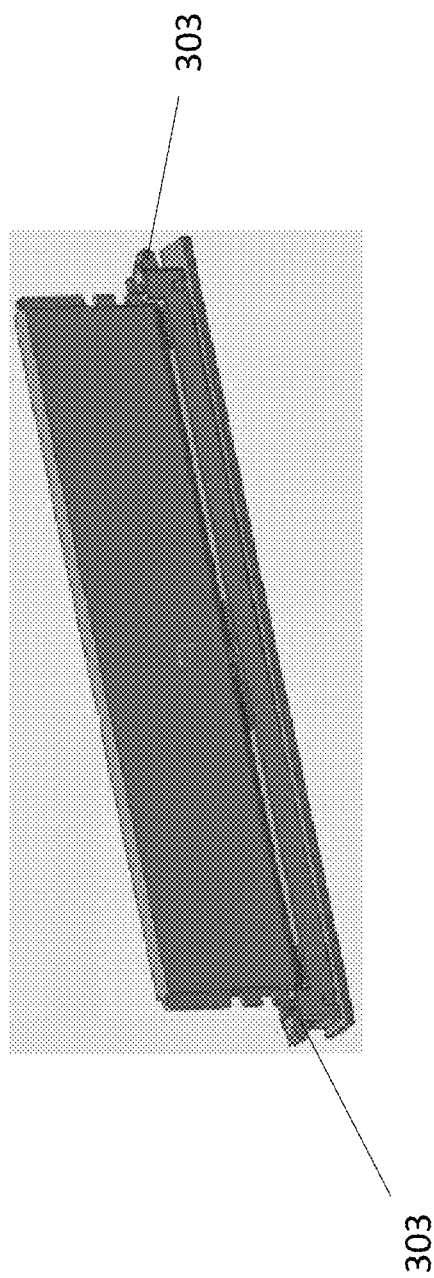
FIGS. 3a and 3b depicts embodiments of a DIMM and ejector to implement the improved DIMM cooling conduit layout.

The ever decreasing minimum feature size achieved by semiconductor chip manufacturers has resulted in each next generation of semiconductor chip having more transistors per die that operate at faster clock speeds than the previous generation. The combination of denser, faster circuitry translates into higher per chip electrical power consumption with each next semiconductor chip generation.

Power consumption per chip has recently pushed past the realm where air cooling of the chips is sufficient to maintain reliable behavior. Whereas traditional computing systems have included one or more fans to pass air over the chips to keep them cool, by contrast, future computing systems will include liquid cooling system technology that keeps chips cool by running conduits of cooled fluid through the chips' mechanical fixturing and/or packaging.

A problem with attempting to integrate liquid cooling technology with the semiconductor chips (mainly memory chips) on a DIMM card is that the connector latch interferes with the layout of the cooling system tubing and complicates the liquid cooling system design.

Particularly when DIMM to DIMM spacing is getting smaller, as observed in FIG. 2a, the liquid coolant conduits/tubes 207 have to run "over the top of" the engaged latch 103 and then "run down" to the lower row(s) of chips. The bending of the conduits 207 not only leads to a more complex and (therefore) expensive solution, but also, is apt to have reliable issues and derated cooling performance (such as a bottleneck in the fluid flow through the conduit bends).

FIG. 2b therefore shows an improved approach that changes the latch design so that it does not interfere with the liquid cooling conduit layout. Here, as observed in FIG. 2b, the upper portions of the latches 203 are removed (as compared to the prior art latches 103) which allows the cooling conduits 217 to run straight across the DIMM. The straight runs of cooling tubing 217 as observed in FIG. 2b are simpler to implement than the approach of FIG. 2a which potentially results in a less expensive and/or more reliable overall solution. In order to further assist the latches 203 from interfering with the liquid cooling layout, the vertical height of the PCB connector 220 can be lowered from its traditional height to a lower height (e.g., 2-3 mm) which, e.g., would seat the latches 203 closer to the PCB.

For example, comparing FIGS. 2a and 2b, note that the bent conduit solution 207 of FIG. 2a requires narrower tubing, whereas, the unbent conduit solution 217 of FIG. 2b allows wider tubing. In various embodiments, the wider tubing 217 allows for better cooling efficiency (more coolant can be passed over a chip per unit of time) and/or less expensive coolant pumping equipment. In various embodiments, in the wider tubing solution 217 of FIG. 2b, the tubes are wide enough to cover more than 50% of a memory chip's package lid surface area (e.g., at least 75% of the package lid surface area is covered by a tube).

Notably, with the upper portion of the latch being removed, the improved "latches" 203 of FIG. 2b are more akin to ejectors 203 rather than latches as explained in more detail below.

Figure 3B:
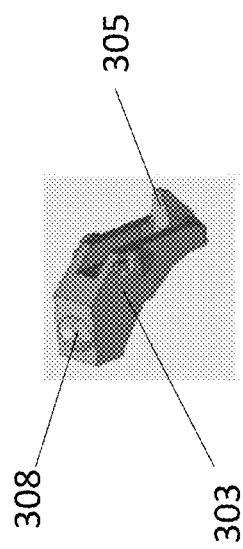

FIGS. 3a and 3b depict the DIMM 301 with the improved ejector 303.

Referring to FIG. 3a, prior to the DIMM being connected to the PCB connector, the ejectors 303 are in an open position. When the DIMM is pressed into the connector, the ejectors 303 rotate to a closed position.

While the DIMM is being inserted into the connector, the bottom of the DIMM presses against a respective foot 305 on the bottom of each ejector. The pressing action of the bottom of the DIMM against the bottom feet 305 of the ejectors causes both ejectors 303 to rotate about a pin/axis which, in turn, swings both ejectors 303 toward the DIMM.

Unlike the prior art solution, however, in the embodiment of FIGS. 3a and 3b, there is no engagement with a notch in the DIMM (because the upper part has been removed).

In order to release the DIMM, a user presses down on a tab 308 that extends from each ejector 303 which, in turn, causes the ejector 308 to rotate to an open position. The rotation of both ejectors 303 helps push the DIMM out of the connector. Specifically, the aforementioned feet 305 on the bottoms of ejectors 303 push the DIMM out of the socket while the ejectors are rotating to the open position. The ejectors 303 then fully swing to the open position.

Without additional engagement from the ejector 303 to lock the DIMM in place, in various embodiments, another mechanical feature (or features) is (are) used to secure the DIMM to the PCB connector.

For example, in one approach, the coolant conduits 217 that run along the DIMM, when secured to the other part(s) of the liquid cooling system, by themselves secure the DIMM in the PCB connector.

Here, in various embodiments, referring back to FIG. 2b, the liquid cooling conduits 217 that run along the chips of the DIMM are in place before the DIMM is placed into the PCB connector. For example, in the particular example of FIG. 2b, the DIMM has associated cooling system connectors 209 that the conduits 217 are connected to and are part of the overall DIMM.

When the DIMM is plugged into the PCB connector, the liquid cooling system connectors 209 are also connected to corresponding cooling system components/connectors on the PCB. With the DIMM inserted into the PCB board connector and connected to the liquid cooling system connectors 209, the presence of the conduit tubes 217 across the DIMM are sufficient to prevent the DIMM from releasing the PCB connector.

In same or alternate embodiments, some kind of DIMM brace or DIMM bracket can be fitted over the DIMM and secured to the PCB.

The described latch/ejector can be used in cooling solutions other than directly running liquid cooling conduits/tubes between DIMMs. For example, if heat spreaders (metal, heat pipe or vapor chamber etc.) are used to conduct heat outside of the DIMM region but are connected to a liquid cooling loop within the same system, the proposed reduced profile ejector will reduce the design complexity and reduce conductive resistance of the loop.

Traditional DIMMs have dynamic random access memory (DRAM). Newer, emerging DIMMs have byte addressable non-volatile memory (e.g., a three dimensional cross point memory where resistive storage cells are stacked above the chip substrate), such as Optane™ memory from Intel Corporation or a combination of DRAM and byte addressable non-volatile memory. The teachings provided above are applicable to any of these types of DIMMs.

It is pertinent to point out that the teachings above can potentially be applied to other modules besides DIMMs. For example, various other kinds of modules having one or more semiconductor chips that plug into a PCB may include a low vertical profile ejector so that the module's liquid cooling solution is easier to implement (e.g., straight line conduits as described above). The chips that can be disposed on such modules can be any of a number of different high performance semiconductor chips (e.g., system-on-chip, accelerator chip (e.g., neural network processor), graphics processing unit (GPU), general purpose graphics processing unit (GPGPU), field programmable gate array (FPGA), application specific integrated circuit (ASIC)), an "X" processing unit ("XPU") where "X" can be any processor other than a general purpose processor (e.g., etc. G for graphics, D for data, I for infrastructure, etc.).

A PCB board having a connector that makes use of the teachings herein can be integrated into a chassis having dimensions that are compatible with an industry standard rack (such as racks having 19" or 23" widthwise openings and having mounting holes for chassis having heights of specific height units (e.g., 1U, 2U, 3U where U=1.75"). One example is the IEC 60297 Mechanical structures for electronic equipment—Dimensions of mechanical structures of the 482.6 mm (19 in) series. Generally, however, a chassis of any dimension is possible.

The electrical I/Os of the chip package to motherboard connections described above may be compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

A PCB board having a connector that makes use of the teachings provided above, and/or the PCB board's associated electronic system, may contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections that traditional computers. One or more dis-aggregated computers and/or traditional computers/servers can be identified as a Point of Delivery (PoD) for computing system function in, e.g., the larger configuration of an information technology (IT) implementation such as a data center.

Figure 4:
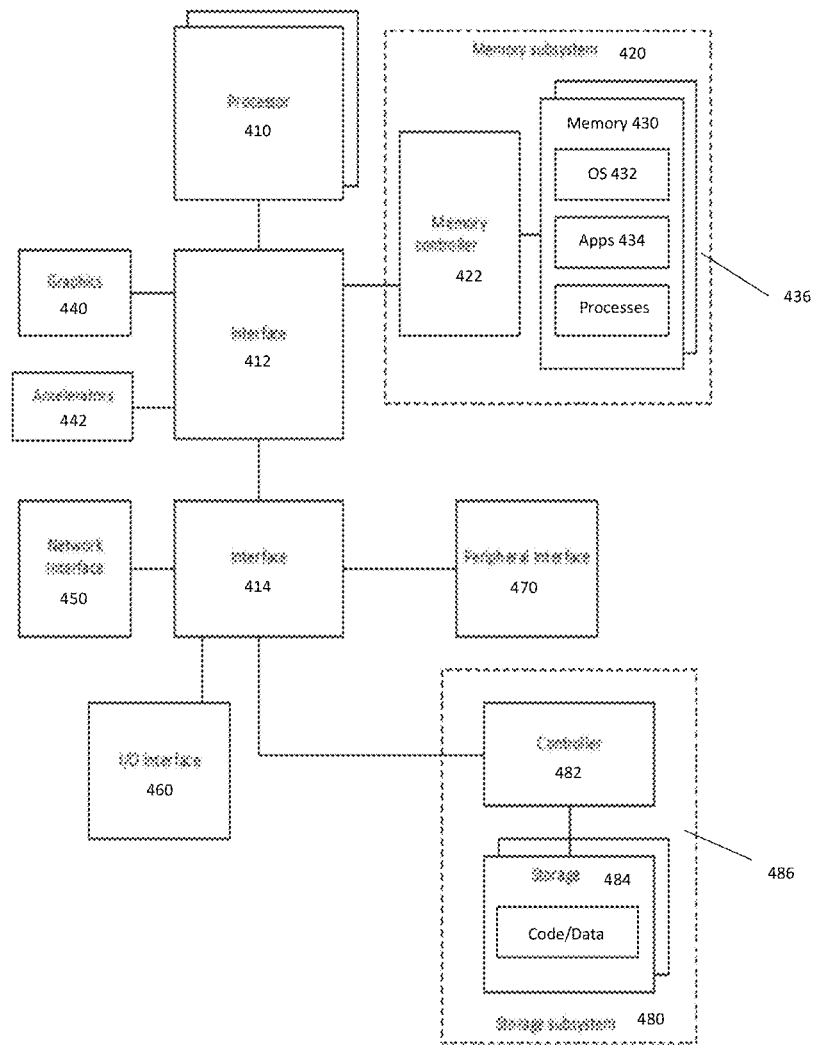
FIG. 4 shows a computing system.

FIG. 4 depicts an example system. The system can use the teachings provided herein. System 400 includes processor 410, which provides processing, operation management, and execution of instructions for system 400. Processor 410 can include any type of microprocessor, central processing unit (CPU), graphics processing unit (GPU), processing core, or other processing hardware to provide processing for system 400, or a combination of processors. Processor 410 controls the overall operation of system 400, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 400 includes interface 412 coupled to processor 410, which can represent a higher speed interface or a high throughput interface for system components that needs higher bandwidth connections, such as memory subsystem 420 or graphics interface components 440, or accelerators 442. Interface 412 represents an interface circuit, which can be a standalone component or integrated onto a processor die. Where present, graphics interface 440 interfaces to graphics components for providing a visual display to a user of system 400. In one example, graphics interface 440 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 440 generates a display based on data stored in memory 430 or based on operations executed by processor 410 or both. In one example, graphics interface 440 generates a display based on data stored in memory 430 or based on operations executed by processor 410 or both.

Accelerators 442 can be a fixed function offload engine that can be accessed or used by a processor 410. For example, an accelerator among accelerators 442 can provide compression (DC) capability, cryptography services such as public key encryption (PKE), cipher, hash/authentication capabilities, decryption, or other capabilities or services. In some embodiments, in addition or alternatively, an accelerator among accelerators 442 provides field select controller capabilities as described herein. In some cases, accelerators 442 can be integrated into a CPU socket (e.g., a connector to a motherboard or circuit board that includes a CPU and provides an electrical interface with the CPU). For example, accelerators 442 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 442 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 420 represents the main memory of system 400 and provides storage for code to be executed by processor 410, or data values to be used in executing a routine. Memory subsystem 420 can include one or more memory devices 430 such as read-only memory (ROM), flash memory, volatile memory, or a combination of such devices. Memory 430 stores and hosts, among other things, operating system (OS) 432 to provide a software platform for execution of instructions in system 400. Additionally, applications 434 can execute on the software platform of OS 432 from memory 430. Applications 434 represent programs that have their own operational logic to perform execution of one or more functions. Processes 436 represent agents or routines that provide auxiliary functions to OS 432 or one or more applications 434 or a combination. OS 432, applications 434, and processes 436 provide software logic to provide functions for system 400. In one example, memory subsystem 420 includes memory controller 422, which is a memory controller to generate and issue commands to memory 430. It will be understood that memory controller 422 could be a physical part of processor 410 or a physical part of interface 412. For example, memory controller 422 can be an integrated memory controller, integrated onto a circuit with processor 410. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WI02 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 400 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 400 includes interface 414, which can be coupled to interface 412. In one example, interface 414 represents an interface circuit, which can include standalone components and integrated circuitry. In one example, multiple user interface components or peripheral components, or both, couple to interface 414. Network interface 450 provides system 400 the ability to communicate with remote devices (e.g., servers or other computing devices) over one or more networks. Network interface 450 can include an Ethernet adapter, wireless interconnection components, cellular network interconnection components, USB (universal serial bus), or other wired or wireless standards-based or proprietary interfaces. Network interface 450 can transmit data to a remote device, which can include sending data stored in memory. Network interface 450 can receive data from a remote device, which can include storing received data into memory. Various embodiments can be used in connection with network interface 450, processor 410, and memory subsystem 420.

In one example, system 400 includes one or more input/output (I/O) interface(s) 460. I/O interface 460 can include one or more interface components through which a user interacts with system 400 (e.g., audio, alphanumeric, tactile/touch, or other interfacing). Peripheral interface 470 can include any hardware interface not specifically mentioned above. Peripherals refer generally to devices that connect dependently to system 400. A dependent connection is one where system 400 provides the software platform or hardware platform or both on which operation executes, and with which a user interacts.

In one example, system 400 includes storage subsystem 480 to store data in a nonvolatile manner. In one example, in certain system implementations, at least certain components of storage 480 can overlap with components of memory subsystem 420. Storage subsystem 480 includes storage device(s) 484, which can be or include any conventional medium for storing large amounts of data in a nonvolatile manner, such as one or more magnetic, solid state, or optical based disks, or a combination. Storage 484 holds code or instructions and data 486 in a persistent state (e.g., the value is retained despite interruption of power to system 400). Storage 484 can be generically considered to be a "memory," although memory 430 is typically the executing or operating memory to provide instructions to processor 410. Whereas storage 484 is nonvolatile, memory 430 can include volatile memory (e.g., the value or state of the data is indeterminate if power is interrupted to system 400). In one example, storage subsystem 480 includes controller 482 to interface with storage 484. In one example controller 482 is a physical part of interface 414 or processor 410 or can include circuits or logic in both processor 410 and interface 414.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 400. More specifically, power source typically interfaces to one or multiple power supplies in system 600 to provide power to the components of system 400. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 400 can be implemented as a disaggregated computing system. For example, the system 600 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 5:
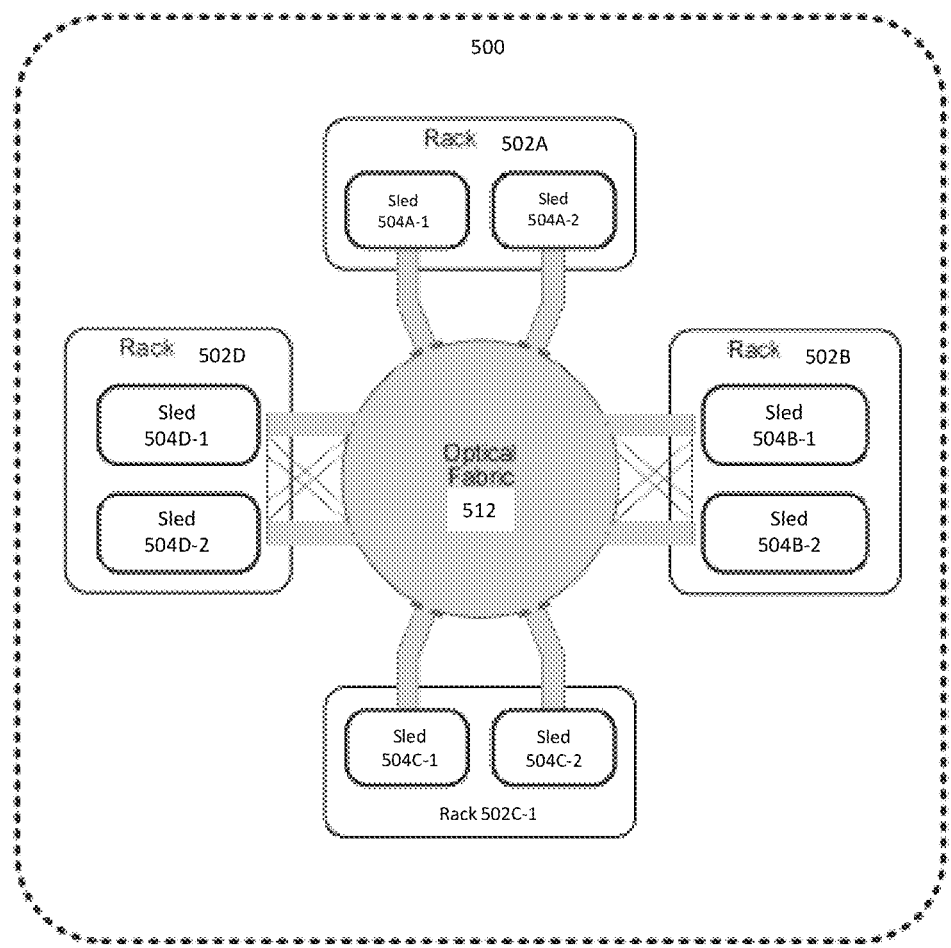
FIG. 5 shows a data center.

FIG. 5 depicts an example of a data center. Various embodiments can be used in or with the data center of FIG. 5. As shown in FIG. 5, data center 500 may include an optical fabric 512. Optical fabric 512 may generally include a combination of optical signaling media (such as optical cabling) and optical switching infrastructure via which any particular sled in data center 500 can send signals to (and receive signals from) the other sleds in data center 500. However, optical, wireless, and/or electrical signals can be transmitted using fabric 512. The signaling connectivity that optical fabric 512 provides to any given sled may include connectivity both to other sleds in a same rack and sleds in other racks. Data center 500 includes four racks 502A to 502D and racks 502A to 502D house respective pairs of sleds 504A-1 and 504A-2, 504B-1 and 504B-2, 504C-1 and 504C-2, and 504D-1 and 504D-2. Thus, in this example, data center 500 includes a total of eight sleds. Optical fabric 512 can provide sled signaling connectivity with one or more of the seven other sleds. For example, via optical fabric 512, sled 504A-1 in rack 502A may possess signaling connectivity with sled 504A-2 in rack 502A, as well as the six other sleds 504B-1, 504B-2, 504C-1, 504C-2, 504D-1, and 504D-2 that are distributed among the other racks 502B, 502C, and 502D of data center 500. The embodiments are not limited to this example. For example, fabric 512 can provide optical and/or electrical signaling.

Figure 6:
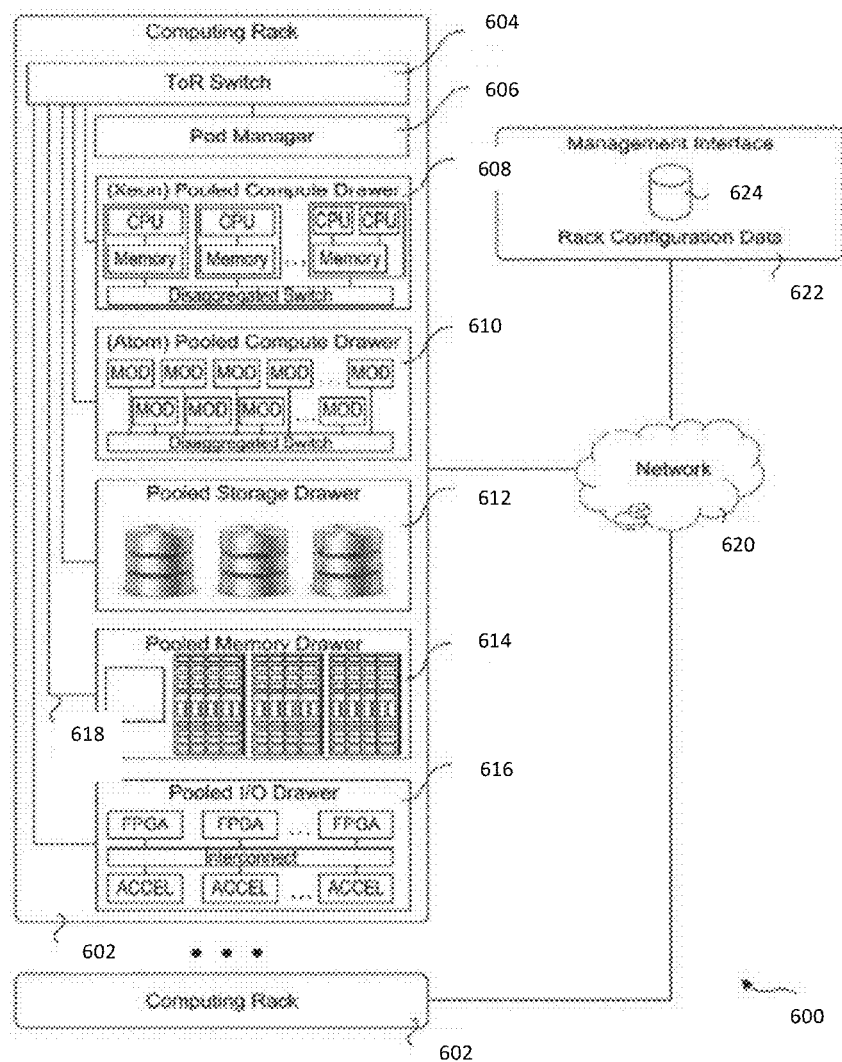
FIG. 6 shows a rack.

FIG. 6 depicts an environment 600 includes multiple computing racks 602, each including a Top of Rack (ToR) switch 604, a pod manager 606, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 608, and INTEL® ATOM™ pooled compute drawer 210, a pooled storage drawer 212, a pooled memory drawer 214, and an pooled I/O drawer 616. Each of the pooled system drawers is connected to ToR switch 604 via a high-speed link 618, such as a 40 Gigabit/second (Gb/s) or 100 Gb/s Ethernet link or an 100+Gb/s Silicon Photonics (SiPh) optical link. In one embodiment high-speed link 618 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 600 may be interconnected via their ToR switches 604 (e.g., to a pod-level switch or data center switch), as illustrated by connections to a network 620. In some embodiments, groups of computing racks 602 are managed as separate pods via pod manager(s) 606. In one embodiment, a single pod manager is used to manage all of the racks in the pod. Alternatively, distributed pod managers may be used for pod management operations.

Multiple rack environment 600 further includes a management interface 622 that is used to manage various aspects of the RSD environment. This includes managing rack configuration, with corresponding parameters stored as rack configuration data 624.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

An apparatus has been described. The apparatus includes a printed circuit board (PCB) dual in-line memory module (DIMM) connector having ejectors, the ejectors having a small enough vertical profile to permit unbent liquid cooling conduits to run across the DIMM's semiconductor chips. In an embodiment, the ejectors have tabs that, when pressed, helps to eject the DIMM from the PCB DIMM connector. A dual in-line memory module (DIMM) having unbent liquid cooling conduits that run from one end of the DIMM to the other end of the DIMM has been described. An electronic system has been described. The electronic system has a liquid cooling system; a printed circuit board (PCB), a dual in-line memory module (DIMM) connector on the PCB; and a DIMM that is plugged into the DIMM connector. The DIMM has liquid cooling conduits that run straight across the DIMM. The liquid cooling conduits are connected to the liquid cooling system. In an embodiment, the DIMM connector has ejectors on ends of the DIMM that reside beneath the liquid cooling conduits. In an embodiment, the ejectors have tabs that, when pressed, help to eject the DIMM from the DIMM connector.

The invention claimed is:

1. An apparatus, comprising:
a printed circuit board (PCB) dual in-line memory module (DIMM) connector having ejectors, the ejectors having a small enough vertical profile to permit unbent liquid cooling conduits to run across the DIMM's semiconductor chips.

2. The apparatus of claim 1, wherein the ejectors have tabs that, when pressed, helps to eject the DIMM from the PCB DIMM connector.

3. The apparatus of claim 1, wherein the PCB DIMM connector has a vertical height of 3 mm or lower.

4. A dual in-line memory module (DIMM), comprising:
unbent liquid cooling conduits that run from one end of the DIMM to the other end of the DIMM.

5. The DIMM of claim 4, wherein the unbent liquid cooling conduits, when connected to a liquid cooling system when the DIMM is connected to a printed circuit board (PCB) connector, secure the DIMM to the PCB connector.

6. An electronic system, comprising:
a liquid cooling system;
a printed circuit board (PCB), a dual in-line memory module (DIMM) connector on the PCB; and
a DIMM that is plugged into the DIMM connector, the DIMM having liquid cooling conduits that run straight across the DIMM, the liquid cooling conduits connected to the liquid cooling system, wherein the DIMM connector comprises ejectors that reside beneath the liquid cooling conduits.

7. The electronic system of claim 6, wherein the ejectors have tabs that, when pressed, help to eject the DIMM from the DIMM connector.

8. The electronic system of claim 7, wherein the electronic system is a computer system.

9. The electronic system of claim 6, wherein the DIMM connector has a vertical height of 3 mm or lower.

* * * * *